United States Patent
Peng et al.

(10) Patent No.: US 11,218,124 B2
(45) Date of Patent: Jan. 4, 2022

(54) CIRCUIT FOR INCREASING OUTPUT DIRECT-CURRENT LEVEL OF TRANSIMPEDANCE AMPLIFICATION STAGE IN TIA

(71) Applicant: XIAMEN UX HIGH-SPEED IC CO., LTD., Fujian (CN)

(72) Inventors: Huiyao Peng, Xiamen (CN); Wei Chen, Xiamen (CN); Jiacheng Hong, Xiamen (CN); Jianhua Pan, Xiamen (CN)

(73) Assignee: XIAMEN UX HIGH-SPEED IC CO., LTD., Fujian (CN)

( * ) Notice: Subject to any disclaimer, the term of this patent is extended or adjusted under 35 U.S.C. 154(b) by 0 days.

(21) Appl. No.: 16/977,462

(22) PCT Filed: Mar. 14, 2018

(86) PCT No.: PCT/CN2018/078974
§ 371 (c)(1),
(2) Date: Sep. 1, 2020

(87) PCT Pub. No.: WO2019/173985
PCT Pub. Date: Sep. 19, 2019

(65) Prior Publication Data
US 2020/0412309 A1 Dec. 31, 2020

(51) Int. Cl.
*H03F 3/08* (2006.01)
*H03F 3/45* (2006.01)

(52) U.S. Cl.
CPC ........... *H03F 3/45183* (2013.01); *H03F 3/08* (2013.01)

(58) Field of Classification Search
CPC ....................................................... H03F 3/08
USPC ......................................................... 330/308
See application file for complete search history.

(56) References Cited

U.S. PATENT DOCUMENTS

| | | | |
|---|---|---|---|
| 6,864,749 B2 * | 3/2005 | Seetharaman | H03F 3/087 250/214 A |
| 8,742,852 B2 * | 6/2014 | Sugimoto | H03F 3/087 330/308 |
| 8,766,728 B2 * | 7/2014 | Ito | H03F 3/08 330/308 |

* cited by examiner

*Primary Examiner* — Henry Choe
(74) *Attorney, Agent, or Firm* — Leong C. Lei

(57) ABSTRACT

A circuit for increasing an output direct-current level of a transimpedance amplification stage in a TIA (Trans-Impedance Amplifier) includes a transimpedance amplification stage, a differential amplification stage, a level boosting unit, and a DC-restore loop. An input terminal of the transimpedance amplification stage is used for inputting a photocurrent signal. An output terminal of the transimpedance amplification stage is directly connected to an input terminal of the differential amplification stage.

7 Claims, 4 Drawing Sheets

CIRCUIT FOR INCREASING OUTPUT DIRECT-CURRENT LEVEL OF TRANSIMPEDANCE AMPLIFICATION STAGE IN TIA

BACKGROUND OF THE INVENTION

1. Field of the Invention

The present invention relates to an electronic circuit, and more particularly to a circuit for increasing the output direct-current level of a transimpedance amplification stage in a TIA (Trans-Impedance Amplifier).

2. Description of the Prior Art

In optical communication, a conventional transimpedance amplifier (TIA) is mainly composed of a transimpedance amplification stage and a differential amplification stage. The transimpedance amplification stage converts a photocurrent signal into a voltage signal, and the differential amplification stage further amplifies the voltage signal outputted from the front stage to meet the requirement of the amplitude of the output voltage. The transimpedance amplification stage is usually composed of a single-ended circuit, and its output DC level often cannot match the input DC level of the differential amplification stage, and it is necessary to add other circuit structures to achieve level matching.

As shown in FIG. 1, a transimpedance amplification stage consists of an NMOS transistor MN1, a PMOS transistor MP1, and a variable resistance RF. The output DC level is V1. When Iin=0, $V1=VGS_{MN1}$. FIG. 2 shows the input stage of the differential amplification stage. Due to the increased tail current Itail1, the required input DC level is $V2=VGS_{MN5}+Vtail$. Because $VGS_{MN1} \approx VGS_{MN5}$, V1 and V2 differ by a Vtail voltage, it is not good for direct connection. The method currently adopted is to use a CS amplification stage that includes an NMOS transistor MN3 and a resistor R3 to boost the V1 level and then connect it to the differential amplification stage.

As to the CS amplification stage composed of the NMOS transistor MN3 and the resistor R3, its bias current is determined by the transimpedance amplification stage. If there is a deviation in the production process or $I_{in} \neq 0$, V1 will change, and the bias current of the CS amplification stage will change accordingly, and the bandwidth and gain of the entire TIA will change, affecting the stability of the overall circuit.

SUMMARY OF THE INVENTION

The primary object of the present invention is to provide a circuit for increasing the output direct-current level of a transimpedance amplification stage in a TIA (Trans-Impedance Amplifier), which can realize the DC level matching between a transimpedance amplification stage and a differential amplification stage without introducing an additional intermediate stage, thereby improving the stability of the overall circuit.

In order to achieve the above object, the solution of the present invention is described below.

A circuit for increasing an output direct-current level of a transimpedance amplification stage in a TIA (Trans-Impedance Amplifier), comprises a transimpedance amplification stage, a differential amplification stage, a level boosting unit, and a DC-restore loop. An input terminal of the transimpedance amplification stage is used for inputting a photocurrent signal. An output terminal of the transimpedance amplification stage is directly connected to an input terminal of the differential amplification stage.

The DC-restore loop includes a pseudo transimpedance amplification stage, a first filter unit, a second filter unit, a DC-restore operational amplifier, and a DC path unit. The transimpedance amplification stage and the pseudo transimpedance amplification stage are connected in parallel between a power supply VDD and the level boosting unit. The output terminal of the transimpedance amplification stage is connected to an inverting input terminal of the DC-restore operational amplifier through a first filter circuit. An output terminal of the pseudo transimpedance amplification stage is connected to a non-inverting input terminal of the DC-restore operational amplifier through the second filter unit. An output terminal of the DC-restore operational amplifier is connected to the DC path unit. The DC path unit is further connected to the input terminal of the transimpedance amplification stage.

The level boosting unit includes a tail current source Itail and a capacitor C3. The tail current source Itail is connected in parallel with the capacitor C3. One end of the tail current source Itail is connected to the transimpedance amplification stage and the pseudo transimpedance amplification stage, and another end of the tail current source Itail is grounded.

The pseudo transimpedance amplification stage includes a PMOS transistor MP2, an NMOS transistor MN2, and a resistor Rdummy. A source of the PMOS transistor MP2 is connected to the power supply VDD. A gate of the PMOS transistor MP2 is connected to one end of the resistor Rdummy. A drain of the PMOS transistor MP2 is connected to another end of the resistor Rdummy. A gate of the NMOS transistor MN2 is connected to the end, connected to the gate of the PMOS transistor MP2, of the resistor Rdummy. A drain of the NMOS transistor MN2 is connected to the end, connected to the drain of the PMOS transistor MP2, of the resistor Rdummy. A source of the NMOS transistor MN2 is connected to the level boosting unit. The end, connected to the PMOS transistor MP2 and the NMOS transistor MN2, of the resistor Rdummy serves as the output terminal of the pseudo transimpedance amplification stage and is connected to the second filter unit.

The DC path unit includes an NMOS transistor MN0. A gate of the NMOS transistor MN0 is connected to the output terminal of the DC-restore operational amplifier. A drain of the NMOS transistor MN0 is connected to the input terminal of the transimpedance amplification stage. A source of the NMOS transistor MN0 is grounded.

The DC-restore operational amplifier includes a PMOS transistor MP7, an NMOS transistor MN7, a PMOS transistor MP8, an NMOS transistor MN8, a PMOS transistor MP9, a resistor Rc, a capacitor Cc, a tail current source Itail2, and a tail current source Itail3. A gate of the NMOS transistor MN7 is connected to the inverting input terminal of the DC-restore operational amplifier. A source of the NMOS transistor MN7 is grounded via the tail current source Itail2. A drain of the NMOS transistor MN7 is connected to a drain of the PMOS transistor MP7. The drain of the NMOS transistor MN7 is further connected to a gate of the PMOS transistor MP7. A source of the PMOS transistor MP7 is connected to the power supply VDD.

A gate of the NMOS transistor MN8 is connected to the non-inverting input terminal INP of the DC-restore operational amplifier. A source of the NMOS transistor MN8 is grounded via the tail current source Itail2. A drain of the NMOS transistor MN8 is connected to a drain of the PMOS transistor MP8 and further connected to the output terminal of the DC-restore operational amplifier via the resistor Rc and the capacitor Cc in turn. A gate of the PMOS transistor MP8 is connected to the gate of the PMOS transistor MP7. A source of the PMOS transistor MP8 is connected to the power supply VDD.

A gate of the PMOS transistor MP9 is connected to the drain of the PMOS transistor MP8. A source of the PMOS transistor MP9 is connected to the power supply VDD. A drain of the PMOS transistor MP9 is grounded via the tail current source Itail3, and the drain of the PMOS transistor MP9 is further connected to the output terminal of the DC-restore operational amplifier.

The transimpedance amplification stage includes a PMOS transistor MP1, an NMOS transistor MN1, and a variable resistor RF. A gate of the PMOS transistor MP1 is connected to the input terminal of the transimpedance amplification stage. A source of the PMOS transistor MP1 is connected to the power supply VDD. A drain of the PMOS transistor MP1 is connected to the output terminal of the transimpedance amplification stage. A gate of the NMOS transistor MN1 is connected to the input terminal of the transimpedance amplification stage. A source of the NMOS transistor MN1 is connected to the level boosting unit. A drain of the NMOS transistor MN1 is connected to the output terminal of the transimpedance amplification stage. One end of the variable resistor RF is connected to the input terminal of the transimpedance amplification stage, and another end of the variable resistor RF is connected to the output terminal of the transimpedance amplification stage.

The first filter circuit includes a resistor R1 and a capacitor C1. One end of the resistor R1 is connected to the output terminal of the transimpedance amplification stage. Another end of the resistor R1 is grounded via the capacitor C1 and further connected to the inverting input terminal of the DC-restore operational amplifier. The second filter unit includes a resistor R2 and a capacitor C2. One end of the resistor R2 is connected to the output terminal of the pseudo transimpedance amplification stage, and another end of the resistor R2 is grounded via the capacitor C2 and further connected to the non-inverting input terminal of the DC-restore operational amplifier.

After adopting the above solution, the present invention improves the output DC level of the transimpedance amplification stage by introducing the tail current source Itail in the transimpedance amplification stage, so that the output DC level of the transimpedance amplification stage matches the input DC level of the differential amplification stage. In order to avoid the mismatch between the output DC level of the transimpedance amplification stage and the input DC level of the differential amplification stage due to changes in the input current of the transimpedance amplification stage, the present invention adds a DC-restore loop. If the input current of the transimpedance amplification stage increases and changes, under the clamping function of the DC-restore loop, the DC part of the input current of the transimpedance amplification stage is introduced to the ground potential, so that the output DC level of the transimpedance amplification stage is restored, and then the output DC level of the transimpedance amplification stage and the input DC level of the differential amplification stage are matched again, thereby improving the stability of the overall circuit.

DETAILED DESCRIPTION OF THE PREFERRED EMBODIMENTS

Embodiments of the present invention will now be described, by way of example only, with reference to the accompanying drawings.

The present invention discloses a circuit for increasing the output direct-current level of a transimpedance amplification stage in a TIA (Trans-Impedance Amplifier). By means of introducing a level boosting unit 2 and a DC-restore loop 3, the output direct-current level of a transimpedance amplification stage is boosted, thus achieving the purpose of matching the input direct-current level of a differential amplification stage.

Specifically, the circuit for increasing the output direct-current level of a transimpedance amplification stage in a TIA of the present invention comprises a transimpedance amplification stage 1, a differential amplification stage, a level boosting unit 2, and a DC-restore loop 3. An input terminal IN of the transimpedance amplification stage 1 is connected to a photodiode L1 for inputting a photocurrent signal. An output terminal out1 of the transimpedance amplification stage 1 is directly connected to an input terminal of the differential amplification stage. The specific circuit connection relationship of the transimpedance amplification stage 1, the level boosting unit 2 and the DC-restore loop 3 will be detailed below. As for the differential amplification stage, since it is the prior art, it will not be described hereinafter.

Figure 1:
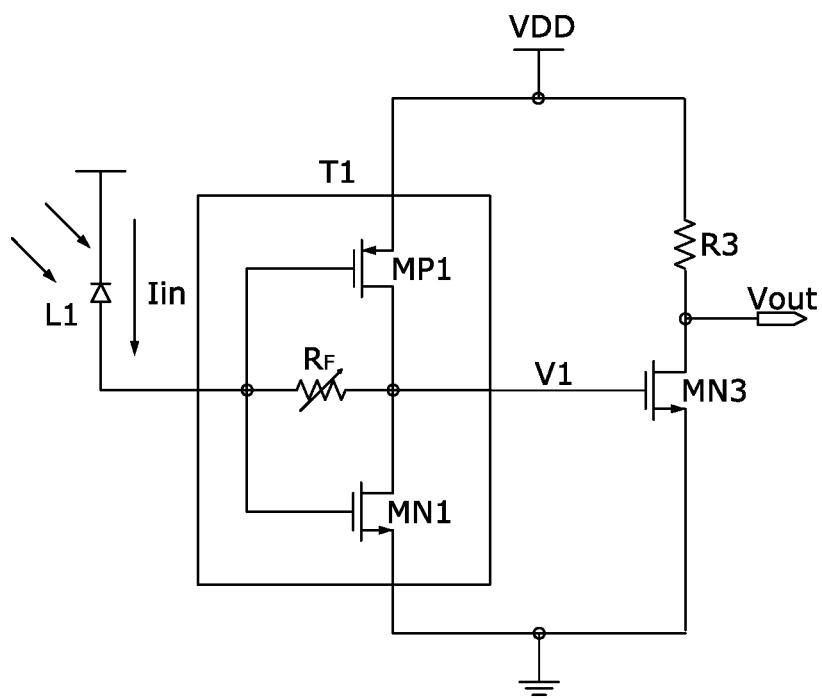
FIG. 1 is circuit diagram of a conventional transimpedance amplification stage.
Figure 2:
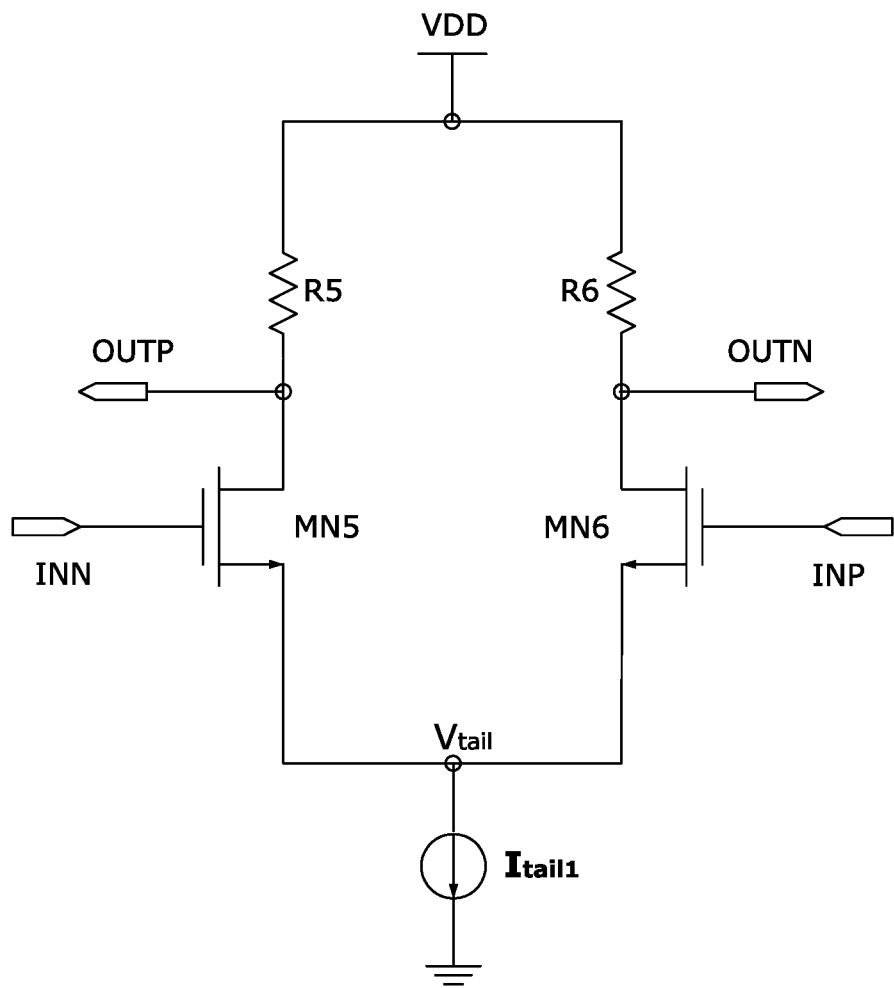
FIG. 2 is circuit diagram of a conventional differential amplification stage.
Figure 3:
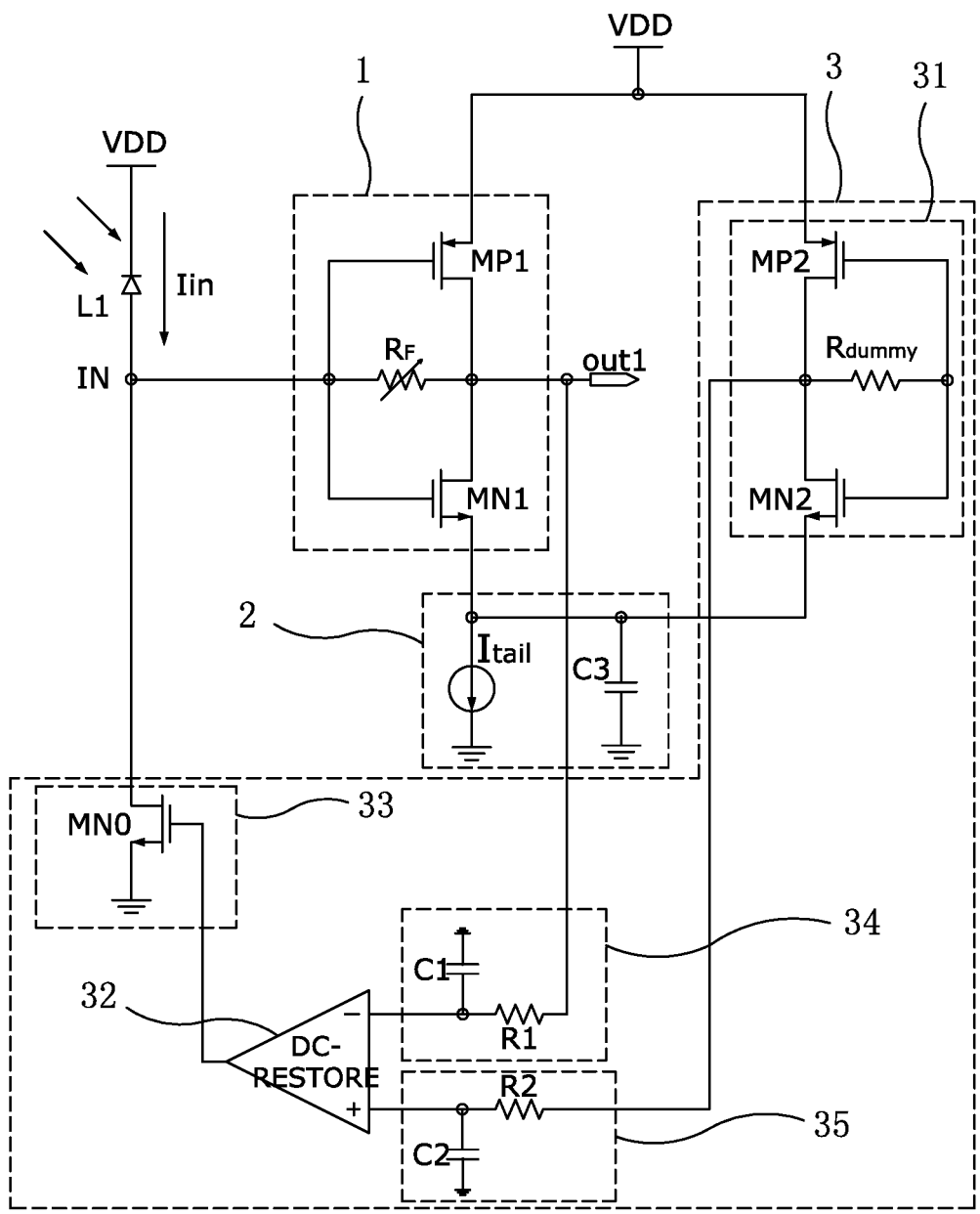
FIG. 3 is circuit diagram of a transimpedance amplification stage of the present invention.

As shown in FIG. 3, the transimpedance amplification stage 1 includes a PMOS transistor MP1, an NMOS transistor MN1, and a variable resistor RF. A gate of the PMOS transistor MP1 is connected to the input terminal IN of the transimpedance amplification stage 1. A source of the PMOS transistor MP1 is connected to a power supply VDD. A drain of the PMOS transistor MP1 is connected to the output terminal out1 of the transimpedance amplification stage 1. A gate of the NMOS transistor MN1 is connected to the input terminal IN of the transimpedance amplification stage 1. A source of the NMOS transistor MN1 is grounded via the level boosting unit 2. A drain of the NMOS transistor MN1 is connected to the output terminal out1 of the transimpedance amplification stage 1. One end of the variable resistor RF is connected to the input terminal IN of the transimpedance amplification stage 1, and another end of the variable resistor RF is connected to the output terminal out1 of the transimpedance amplification stage 1.

The DC-restore loop 3 specifically includes a pseudo transimpedance amplification stage 31, a resistor R1, a resistor R2, a capacitor C1, a capacitor C2, a DC-restore operational amplifier 32, and an NMOS transistor MN0. The pseudo transimpedance amplification stage 31 includes a PMOS transistor MP2, an NMOS transistor MN2, and a resistor Rdummy. A source of the PMOS transistor MP2 is connected to the power supply VDD. A gate of the PMOS transistor MP2 is connected to one end of the resistor Rdummy. A drain of the PMOS transistor MP2 is connected to another end of the resistor Rdummy. A gate of the NMOS transistor MN2 is connected to the end, connected to the gate of the PMOS transistor MP2, of the resistor Rdummy. A drain of the NMOS transistor MN2 is connected to the end, connected to the drain of the PMOS transistor MP2, of the resistor Rdummy. A source of the NMOS transistor MN2 is grounded via the level boosting unit 2.

The end, connected to the PMOS transistor MP2 and the NMOS transistor MN2, of the resistor Rdummy is connected to a non-inverting terminal INP of the DC-restore operational amplifier 32 via the resistor R2. The non-inverting input terminal INP of the DC-restore operational amplifier 32 is grounded via the capacitor C2. The resistor R2 and the capacitor C2 constitute a second filter unit 35. An inverting input terminal INN of the DC-restore operational amplifier 32 is connected to the output terminal out1 of the transimpedance amplification stage via the resistor R1. The inverting input terminal INN of the DC-restore operational amplifier 32 is grounded via the capacitor C1. The resistor R1 and the capacitor C1 constitute a first filter unit 34. An output terminal of the DC-restore operational amplifier 32 is connected to a gate of the NMOS transistor MN0. A source of the NMOS transistor MN0 is grounded. A drain of the NMOS transistor MN0 is connected to the input terminal IN of the transimpedance amplification stage. The NMOS transistor MN0 constitutes a DC path unit 33.

The level boosting unit 2 includes a tail current source Itail and a capacitor C3. The tail current source Itail is connected in parallel with the capacitor C3. One end of the tail current source Itail is grounded. Another end of the tail current source Itail is connected to the source of the NMOS transistor MN1 of the transimpedance amplification stage 1 and further connected to the source of the NMOS transistor MN2 of the pseudo transimpedance amplification stage 31. After adding the tail current Itail, the loop gain of the transimpedance amplification stage 1 will decrease. Adding the capacitor C3 can play the role of high-frequency AC short circuit and improve the loop gain of the transimpedance amplification stage 1.

Figure 4:
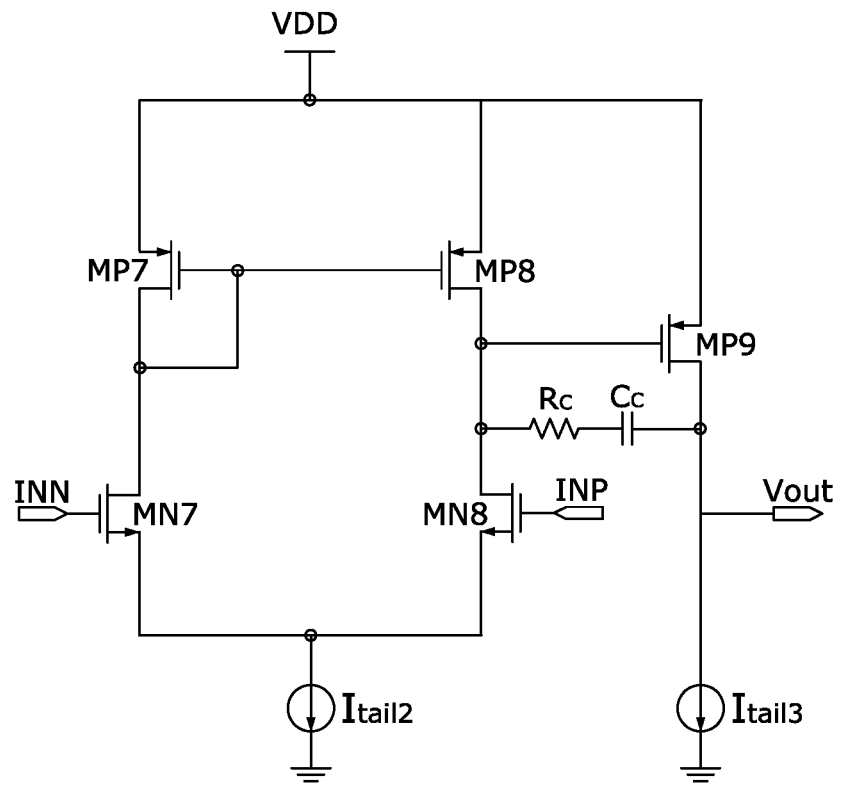
FIG. 4 is circuit diagram of a DC-restore operational amplifier of the present invention.

As shown in FIG. 4, the DC-restore operational amplifier 32 includes a PMOS transistor MP7, an NMOS transistor MN7, a PMOS transistor MP8, an NMOS transistor MN8, a PMOS transistor MP9, a resistor Rc, a capacitor Cc, a tail current source Itail2, and a tail current source Itail3. A gate of the NMOS transistor MN7 is connected to the inverting input terminal of the DC-restore operational amplifier 32. A source of the NMOS transistor MN7 is grounded via the tail current source Itail2. On the one hand, a drain of the NMOS transistor MN7 is connected to a drain of the PMOS transistor MP7, and on the other hand, the drain of the NMOS transistor MN7 is also connected to a gate of the PMOS transistor MP7. A source of the PMOS transistor MP7 is connected to the power supply VDD.

A gate of the NMOS transistor MN8 is connected to the non-inverting input terminal INP of the DC-restore operational amplifier 32. A source of the NMOS transistor MN8 is grounded via the tail current source Itail2. On the one hand, a drain of the NMOS transistor MN8 is connected to a drain of the PMOS transistor MP8, and on the other hand, the drain of the NMOS transistor MN8 is connected to the output terminal out2 of the DC-restore operational amplifier 32 via the resistor Rc and the capacitor Cc in turn. A gate of the PMOS transistor MP8 is connected to the gate of the PMOS transistor MP7. A source of the PMOS transistor MP8 is connected to the power supply VDD. A gate of the PMOS transistor MP9 is connected to the drain of the PMOS transistor MP8. A source of the PMOS transistor MP9 is connected to the power supply VDD. On the one hand, a drain of the PMOS transistor MP9 is grounded via the tail current source Itail3, and on the other hand, the drain of the PMOS transistor MP9 is connected to the output terminal out2 of the DC-restore operational amplifier 32.

Since the tail current introduced by the differential amplification stage causes a mismatch in the DC level between the differential amplification stage and the transimpedance amplificatopm stage 1, the present invention also introduces a tail current source Itail into the transimpedance amplification stage 1 to boost its output DC level. The output DC level of the transimpedance amplification stage 1 is originally determined by the PMOS transistor MP1, the NMOS transistor MN1 and the power supply VDD. After the tail current source Itail is introduced, the output DC level is determined by the tail current source Itail, the PMOS transistor MP1 and the power supply VDD. When the input current Iin of the transimpedance amplification stage 1 is 0 or very small, the output DC level Vout1 of the transimpedance amplification stage 1 is boosted by Vtail on the original basis due to the introduction of the tail current Itail, that is, Vout1=$VGS_{MN1}$+$V_{tail}$, matching the DC level V2.

However, if the tail current source Itail is introduced alone, when the input current Iin of the transimpedance amplification stage 1 increases, its output DC level will decrease due to the increase of the input current Iin, resulting in a mismatch in the DC level. Therefore, while introducing the tail current source hail, the DC-restore loop 3 is introduced. The PMOS transistor MP2, the NMOS transistor MN2 and the resistor Rdummy in the DC-restore loop 3 constitute the pseudo transimpedance amplification stage 31, and its output DC level Vdummy provides a reference level. When the input current Iin of the transimpedance amplification stage 1 is zero or close to zero, the output DC level Vout of the transimpedance amplification stage 1 and the output DC level Vdummy of the pseudo transimpedance amplification stage 31 are equal, and the MN0 transistor is turned off (i.e., disconnected). When the input current Iin of the input terminal IN of the transimpedance amplification stage 1 increases, the output DC level of the transimpedance amplification stage 1 decreases, and the voltage at the non-inverting input terminal is greater than the voltage at the inverting input terminal of the DC-restore operational amplifier 32. As a result, the voltage at the output terminal of the DC-restore operational amplifier 32 rises, and the NMOS transistor MN0 is turned on. The DC part of the input current Iin of the input terminal IN of the transimpedance amplification stage 1 is introduced to the ground potential, so that the output DC level of the transimpedance amplification stage 1 is restored, and then the output DC level Vout1 of the transimpedance amplification stage 1 and the input DC level V2 of the differential amplification stage are matched again. If the current changes again at this time, the output voltage of the DC-restore operational amplifier 32 also changes accordingly, so that the voltage and current of the NMOS transistor MN0 are converted, and the current flowing through the NMOS transistor MN0 increases or decreases, so the output DC level of the transimpedance amplification stage is restored to a level close to Vdummy. The output DC level Vout1 of the transimpedance amplification stage 1 and the input DC level V2 of the differential amplification stage are matched again, thereby improving the stability of the entire circuit.

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A circuit for increasing an output direct-current level of a transimpedance amplification stage in a TIA (Trans-Impedance Amplifier), comprising a transimpedance amplification stage, a differential amplification stage, a level boosting unit, and a DC-restore loop; an input terminal of the transimpedance amplification stage being used for inputting a photocurrent signal, an output terminal of the transimpedance amplification stage being directly connected to an input terminal of the differential amplification stage;

the DC-restore loop including a pseudo transimpedance amplification stage, a first filter unit, a second filter unit, a DC-restore operational amplifier and a DC path unit, the transimpedance amplification stage and the pseudo transimpedance amplification stage are connected in parallel between a power supply VDD and the level boosting unit, the output terminal of the transimpedance amplification stage being connected to an inverting input terminal of the DC-restore operational amplifier through a first filter circuit, an output terminal of the pseudo transimpedance amplification stage being connected to a non-inverting input terminal of the DC-restore operational amplifier through the second filter unit, an output terminal of the DC-restore operational amplifier being connected to the DC path unit, the DC path unit being further connected to the input terminal of the transimpedance amplification stage.

2. The circuit as claimed in claim 1, wherein the level boosting unit includes a tail current source Itail and a capacitor C3, the tail current source Itail is connected in parallel with the capacitor C3, one end of the tail current source Itail is connected to the transimpedance amplification stage and the pseudo transimpedance amplification stage, and another end of the tail current source Itail is grounded.

3. The circuit as claimed in claim 1, wherein the pseudo transimpedance amplification stage includes a PMOS transistor MP2, an NMOS transistor MN2, and a resistor Rdummy; a source of the PMOS transistor MP2 is connected to the power supply VDD, a gate of the PMOS transistor MP2 is connected to one end of the resistor Rdummy, a drain of the PMOS transistor MP2 is connected to another end of the resistor Rdummy; a gate of the NMOS transistor MN2 is connected to the end, connected to the gate of the PMOS transistor MP2, of the resistor Rdummy, a drain of the NMOS transistor MN2 is connected to the end, connected to the drain of the PMOS transistor MP2, of the resistor Rdummy, a source of the NMOS transistor MN2 is connected to the level boosting unit, and the end, connected to the PMOS transistor MP2 and the NMOS transistor MN2, of the resistor Rdummy serves as the output terminal of the pseudo transimpedance amplification stage and is connected to the second filter unit.

4. The circuit as claimed in claim 1, wherein the DC path unit includes an NMOS transistor MN0, a gate of the NMOS transistor MN0 is connected to the output terminal of the DC-restore operational amplifier, a drain of the NMOS transistor MN0 is connected to the input terminal of the transimpedance amplification stage, and a source of the NMOS transistor MN0 is grounded.

5. The circuit as claimed in claim 1, wherein the DC-restore operational amplifier includes a PMOS transistor MP7, an NMOS transistor MN7, a PMOS transistor MP8, an NMOS transistor MN8, a PMOS transistor MP9, a resistor Rc, a capacitor Cc, a tail current source Itail2, and a tail current source Itail3; a gate of the NMOS transistor MN7 is connected to the inverting input terminal of the DC-restore operational amplifier, a source of the NMOS transistor MN7 is grounded via the tail current source Itail2, a drain of the NMOS transistor MN7 is connected to a drain of the PMOS transistor MP7, the drain of the NMOS transistor MN7 is further connected to a gate of the PMOS transistor MP7, a source of the PMOS transistor MP7 is connected to the power supply VDD;

a gate of the NMOS transistor MN8 is connected to the non-inverting input terminal INP of the DC-restore operational amplifier, a source of the NMOS transistor MN8 is grounded via the tail current source Itail2, a drain of the NMOS transistor MN8 is connected to a drain of the PMOS transistor MP8 and further connected to the output terminal of the DC-restore operational amplifier via the resistor Rc and the capacitor Cc in turn; a gate of the PMOS transistor MP8 is connected to the gate of the PMOS transistor MP7, a source of the PMOS transistor MP8 is connected to the power supply VDD;

a gate of the PMOS transistor MP9 is connected to the drain of the PMOS transistor MP8, a source of the PMOS transistor MP9 is connected to the power supply VDD, a drain of the PMOS transistor MP9 is grounded via the tail current source Itail3, and the drain of the PMOS transistor MP9 is further connected to the output terminal of the DC-restore operational amplifier.

6. The circuit as claimed in any one of claims 1-5, wherein the transimpedance amplification stage includes a PMOS transistor MP1, an NMOS transistor MN1, and a variable resistor RF; a gate of the PMOS transistor MP1 is connected to the input terminal of the transimpedance amplification stage, a source of the PMOS transistor MP1 is connected to the power supply VDD, a drain of the PMOS transistor MP1 is connected to the output terminal of the transimpedance amplification stage; gate of the NMOS transistor MN1 is connected to the input terminal of the transimpedance amplification stage, a source of the NMOS transistor MN1 is connected to the level boosting unit, a drain of the NMOS transistor MN1 is connected to the output terminal of the transimpedance amplification stage; one end of the variable resistor RF is connected to the input terminal of the transimpedance amplification stage, and another end of the variable resistor RF is connected to the output terminal of the transimpedance amplification stage.

7. The circuit as claimed in claim 6, wherein the first filter circuit includes a resistor R1 and a capacitor C1, one end of the resistor R1 is connected to the output terminal of the transimpedance amplification stage, another end of the resistor R1 is grounded via the capacitor C1 and further connected to the inverting input terminal of the DC-restore operational amplifier; the second filter unit includes a resistor R2 and a capacitor C2, one end of the resistor R2 is connected to the output terminal of the pseudo transimpedance amplification stage, and another end of the resistor R2 is grounded via the capacitor C2 and further connected to the non-inverting input terminal of the DC-restore operational amplifier.

* * * * *